United States Patent [19]
Boudreaux et al.

[11] Patent Number: 5,631,046
[45] Date of Patent: May 20, 1997

[54] METHOD OF METALLIZING A DIAMOND SUBSTRATE WITHOUT USING A REFRACTORY METAL

[76] Inventors: Paul J. Boudreaux, 7000 Nightingale Ter., Lanham, Md. 20706; George A. De La Grange, 1290 Dorothy Rd., Crownsville, Md. 21032

[21] Appl. No.: 621,553

[22] Filed: Mar. 25, 1996

[51] Int. Cl.$^6$ ....................................... B05D 3/02
[52] U.S. Cl. ................... 427/383.3; 427/383.1; 427/314; 427/250; 427/125; 427/123
[58] Field of Search ...................... 427/250, 125, 427/123, 383.1, 383.3, 314

[56] References Cited

U.S. PATENT DOCUMENTS

| | | | |
|---|---|---|---|
| 5,190,796 | 3/1993 | Iacovangelo | 427/304 |
| 5,262,042 | 11/1993 | Okabayashi | 205/210 |
| 5,334,306 | 8/1994 | Dautremont-Smith | 205/131 |
| 5,371,407 | 12/1994 | Goldman | 257/675 |
| 5,382,758 | 1/1995 | Iacovangelo et al. | 174/262 |
| 5,391,914 | 2/1995 | Sullivan et al. | 257/635 |
| 5,421,989 | 6/1995 | Stamp et al. | 205/166 |

FOREIGN PATENT DOCUMENTS

0717125A1   6/1996   European Pat. Off. .

OTHER PUBLICATIONS

Lance A.Glasser, A Road Map to ARPA Involvement in Electronic Packaging, Apr. 1993, IEEE pp. 82–86.

Meyyappan et al, Thin Solid Films 253 (1994) pp. 407–412.

Pimenov et al, Appl. Phys. lett. 64(15), Apr. 1994, pp. 1935–1937.

*Primary Examiner*—Roy V. King
*Attorney, Agent, or Firm*—Robert D. Morelli

[57] ABSTRACT

A method of metallizing a diamond substrate without using a refractory metal by firing the diamond substrate at approximately 850° C. for ten minutes in order to de-hydrogenate and oxidize the surface of the diamond substrate; applying any suitable metal such as gold, silver, or copper in any suitable form as an interconnect layer to the diamond substrate using any suitable technique such as thick-film or direct-write; drying the interconnect layer on the diamond substrate at approximately 150° C. for fifteen minutes in order to remove any volatile solvent that may be contained within the interconnect layer; and firing the diamond substrate and the interconnect layer at approximately 850° C. for ten minutes in order to adhere the interconnect layer to the diamond substrate.

16 Claims, No Drawings

METHOD OF METALLIZING A DIAMOND SUBSTRATE WITHOUT USING A REFRACTORY METAL

FIELD OF THE INVENTION

The present invention relates to a method of metallizing a diamond substrate and, more particularly, to a method of metallizing a diamond substrate without using a refractory metal.

BACKGROUND OF THE INVENTION

Diamond is nature's best thermal conductor. Natural single crystal diamond has a thermal conductivity of 2000 W/(m° C.) while the less expensive chemically vapor deposited (CVD) polycrystalline diamond has a thermal conductivity in the range from 500 W/(m° C.) to 1600 W/(m° C.). The materials with the closest thermal conductivity to diamond are silver at 428 W/(m° C.), copper at 396 W/(m° C.), and aluminum at 237 W/(m° C.). Silver, copper, and aluminum are electrically conductive while diamond is not (i.e., diamond is an insulator). Therefore, diamond does not require the use of an added insulating layer when used as a heat sink for an electronic device as does silver, copper, and aluminum. The thermal conductivity numbers for diamond, silver, copper, and aluminum indicate that for a given heat-sink specification, a diamond heat-sink would be smaller than a thermally-equivalent heat-sink made of silver, copper, or aluminum. Also, for a given heat-sink size, a diamond heat-sink would dissipate more heat than would an equally-sized heat-sink made of silver, copper, or aluminum.

Because of the foregoing reasons, diamond has received much attention as the substrate of choice for products that push the limit of either heat dissipation or size. The U.S. Department of Defense's Advanced Research Projects Agency (ARPA) is conducting research on diamond substrates as a packaging technology for its High-Performance Computing and Communication Initiative. ARPA envisions using diamond substrates to provide thermal management of its three dimensional (3D) supercomputer modules. A diamond substrate would provide the possibility of higher clock speed (i.e., higher performance), smaller size, and/or lower operating temperature (i.e., higher reliability).

To take full advantage of the thermal conductivity and the insulating characteristics of diamond, it would be beneficial to form conductive interconnections on the diamond substrate so that semiconductor chips/wafers may be placed directly onto the diamond substrate for ease of interconnection to another semiconductor chip/wafer and heat dissipation. Standard metals used for interconnect (i.e., gold, silver, and copper) do not adhere well to a diamond substrate. Untreated gold, silver, and copper tends to flake off of a diamond substrate. Numerous prior art patents such as U.S. Pat. No. 5,421,989 entitled "PROCESS FOR THE METALLIZATION OF NONCONDUCTIVE SUBSTRATES WITH ELIMINATION OF ELECTROLESS METALLIZATION"; U.S. Pat. No. 5,391,914 entitled "DIAMOND MULTILAYER MULTICHIP MODULE SUBSTRATE"; U.S. Pat. No. 5,382,758 entitled "DIAMOND SUBSTRATES HAVING METALLIZED VIAS"; 5,371,407 entitled "ELECTRONIC CIRCUIT WITH DIAMOND SUBSTRATE AND CONDUCTIVE VIAS"; U.S. Pat No. 5,334,306 entitled "METALLIZED PATHS ON DIAMOND SURFACES"; U.S. Pat. No. 5,262,042 entitled "SIMPLIFIED METHOD FOR DIRECT ELECTROPLATING OF DIELECTRIC SUBSTRATES"; and U.S. Pat. No. 5,190,796 entitled "IMPROVED METHOD OF APPLYING METAL COATINGS ON DIAMOND AND ARTICLES MADE THEREFROM," have all attempted to solve this problem by adding something to the interconnect metal such as a refractory metal, a noble metal, or graphite. All of the U.S. patents listed above are hereby incorporated by reference into the specification of the present invention.

When a refractory metal is used, it is typically sputtered onto a diamond substrate and heated to a temperature above 900° C. A carbide of diamond results. Interconnect metal is then applied to the diamond-carbide. At 900° C., the diamond substrate may be damaged by the hot atmosphere. Also, a metal interconnect layer applied to a refractory-metal-created diamond-carbide may blister or de-laminate.

Natural single crystal diamond is prohibitively expensive to use as a substrate. CVD polycrystalline diamond is expensive but not prohibitively so. Refractory metals are expensive and not very effective in achieving good adhesion between a metal interconnect layer and a diamond substrate. Therefore, there is a need for a reliable method of applying metal interconnect to a diamond substrate that is not prohibitively expensive.

SUMMARY OF THE INVENTION

It is an object of the present invention to deposit a metal interconnect layer onto a diamond substrate so that the metal interconnect layer adheres well to the diamond substrate.

It is another object of the present invention to deposit a metal interconnect layer onto a diamond substrate so that the metal interconnect layer adheres well to the diamond substrate without using a refractory metal.

It is another object of the present invention to sinter, or fire, an un-metallized diamond substrate prior to applying a metal interconnect layer without using a refractory metal so that the metal interconnect layer adheres well to the diamond substrate.

The purpose of the present invention is to develop an improved metallization process for diamond substrates. Prior to this invention, standard metals used for interconnect (e.g., gold, silver, copper, etc.) did not adhere well to diamond substrates. Untreated interconnect metal tended to blister, de-laminate, and flake off of the diamond substrate. Attempts to solve this problem have included the use of refractory metals (i.e., tungsten, niobium, molybdenum, chromium, titanium, vanadium, and tantalum). Refractory metals are expensive. The process for applying a refractory metals is complicated (e.g., sputtering titanium). The temperature (e.g., greater than 900° C.) required to form a carbide of diamond so that a metal interconnect layer may be applied to the carbide is high enough to damage the diamond substrate. The equipment required to sputter refractory metals is expensive. Furthermore, the use of a refractory metal has not entirely eliminated blistering or de-lamination of the metal interconnect layer.

The present invention is a simple, not-prohibitively-expensive method of applying metal interconnect to a diamond substrate. The present invention does not require a complicated process, an expensive refractory metal, or an expensive sputtering machine in order to achieve good adhesion of a metal interconnect layer to a diamond substrate.

The present invention consists of the steps of sintering, or firing, an un-metallized diamond substrate (e.g., firing a diamond substrate at 850° C. for ten minutes), applying a metal interconnect layer (e.g., gold, silver, copper, etc.) to the diamond substrate using conventional techniques, drying the metallized substrate in order to remove any volatile solvents that may be present in the metal interconnect layer (e.g., drying the metallized substrate at 150° C. for fifteen minutes), and then sintering, or firing, the metallized diamond substrate to bond the metal interconnect layer to the diamond substrate (e.g., firing the metallized substrate at 850° C. for ten minutes).

DETAILED DESCRIPTION

The present invention is a method of depositing a metal interconnect layer onto a diamond substrate so that the metal interconnect layer adheres well to the diamond substrate. The diamond substrate may be natural diamond or chemically vapor deposited (CVD) polycrystalline diamond. CVD polycrystalline diamond is preferred since it is less expensive than natural diamond. The metal interconnect layer may be any metal that is suitable for use as an interconnect layer (e.g., gold, silver, copper, etc.). The interconnect metal may exist in paste form and may be applied using conventional techniques (e.g., thick-film, direct-write, etc.).

Prior art methods of applying a metal interconnect layer to a diamond substrate include the use of refractory metals such as tungsten, niobium, molybdenum, chromium, titanium, vanadium, and tantalum. These refractory metals are expensive, require a complex application process (i.e., sputtering), require expensive equipment to apply these metals, require a temperature high enough to damage a diamond substrate (e.g., greater than 900° C.), and have not entirely eliminated blistering and de-lamination of a metal interconnect layer that is applied to a diamond substrate.

The present invention is a simple, not-prohibitively-expensive method of applying a metal interconnect layer to a diamond substrate. The present invention does not require a complicated process, an expensive refractory metal, or an expensive sputtering machine in order to achieve good adhesion of a metal interconnect layer to a diamond substrate.

The present invention consists of the steps of sintering, or firing, an un-metallized diamond substrate. The firing temperature is a temperature within the range of 400° C. to 900° C. for a time sufficient to de-hydrogenate the carbon bonds and oxidize the diamond crystallites on the surface of the diamond substrate. It is preferred that the firing temperature be 850° C. and the time be ten minutes. Next, a metal interconnect layer is applied to the surface of the fired diamond substrate. Any suitable metal may be used (e.g., gold, silver, copper, etc.). These metals may be in any form that is convenient for applying the metal to the diamond substrate (e.g., metal paste, metal film, etc.). The metal interconnect layer may be applied using any conventional application technique (e.g., thick-film, direct-write, etc.). Next, the metallized substrate is dried at a temperature and time sufficient to remove any volatile solvent that may be present within the metal interconnect layer. It is preferred that the metallized diamond substrate be fired at 150° C. for fifteen minutes. Next, the metallized and dried substrate is fired at a temperature within the range of 400° C. to 900° C. for a time that is sufficient to bond the metal interconnect layer to the diamond substrate. It is preferred that the metallized and dried substrate be fired at 850° C. for ten minutes.

The first sintering, of firing, step fundamentally changes the chemistry of the surface of the diamond substrate by removing hydrogen that has bonded to dangling carbon bonds on the surface of the diamond substrate. These de-hydrogenated carbon bonds are now available to chemically bond to another material such as the metal matrix in a thick film metal paste. The first firing step also fundamentally changes the topology of the surface of the diamond substrate by removing relatively large quantities of interfacial diamond-like-carbon that exists between the single crystallites of diamond and creates fault lines in the surface of the diamond substrate. The metal interconnect layer may mechanically bond to these fault lines. Therefore, the present invention is a method that provides two different opportunities for a metal interconnect layer to bond with the surface of a diamond substrate.

What is claimed is:

1. A method of metallizing a diamond substrate, comprising the steps of:
   a) firing the diamond substrate at a temperature within the range of 400° C. to 900° C. for a time sufficient to de-hydrogenate and oxidize the surface of the diamond substrate;
   b) applying a metal interconnect layer to the diamond substrate; and
   c) firing the diamond substrate and the metal interconnect layer at a temperature within the range of 400° C. to 900° C. for a time sufficient to adhere the metal interconnect layer to the diamond substrate.

2. The method of claim 1, wherein said step of firing the diamond substrate at a temperature within the range of 400° C. to 900° C. for a time sufficient to de-hydrogenate and oxidize the surface of the diamond substrate is comprised of the step of firing the diamond substrate at a temperature of 850° C. for ten minutes.

3. The method of claim 1, wherein said step of applying a metal interconnect layer to the diamond substrate comprises the step of applying a metal interconnect layer to the diamond substrate wherein said metal interconnect layer is selected from the group consisting of gold, silver, and copper.

4. The method of claim 1, wherein said step of applying a metal interconnect layer to the diamond substrate comprises the step of applying a metal interconnect layer to the diamond substrate wherein said metal interconnect layer is applied using a technique selected from the group consisting of thick-film technique, and direct-write technique.

5. The method of claim 1, wherein said step of firing the diamond substrate and the metal interconnect layer is comprised of the step of firing the diamond substrate and the metal interconnect layer at 850° C. for ten minutes.

6. The method of claim 2, wherein said step of applying a metal interconnect layer to the diamond substrate comprises the step of applying a metal interconnect layer to the diamond substrate wherein said metal interconnect layer is selected from the group consisting of gold, silver, and copper.

7. The method of claim 6, wherein said step of applying a metal interconnect layer to the diamond substrate comprises the step of applying a metal interconnect layer to the diamond substrate wherein said metal interconnect layer is applied using a technique selected from the group consisting of thick-film technique, and direct-write technique.

8. The method of claim 7, wherein said step of firing the diamond substrate and the metal interconnect layer is comprised of the step of firing the diamond substrate and the metal interconnect layer at 850° C. for ten minutes.

9. A method of metallizing a diamond substrate, comprising the steps of:
   a) firing the diamond substrate at a temperature within the range of 400° C. to 900° C. for a time sufficient to de-hydrogenate and oxidize the surface of the diamond substrate;

b) applying a metal interconnect layer to the diamond substrate;

c) firing the metal interconnect layer on the diamond substrate at 150° C. for 15 minutes; and d) firing the metal interconnect layer and the diamond substrate a second time at a temperature within the range of 400° C. to 900° C. for a time sufficient to adhere the metal interconnect layer to the diamond substrate.

10. The method of claim 9, wherein said step of firing the diamond substrate at a temperature within the range of 400° C. to 900° C. for a time sufficient to de-hydrogenate and oxidize the surface of the diamond substrate is comprised of the step of firing the diamond substrate at a temperature of 850° C. for ten minutes.

11. The method of claim 9, wherein said step of applying a metal interconnect layer to the diamond substrate comprises the step of applying a metal interconnect layer to the diamond substrate wherein said metal interconnect layer is selected from the group consisting of gold, silver, and copper.

12. The method of claim 9, wherein said step of applying a metal interconnect layer to the diamond substrate comprises the step of applying a metal interconnect Layer to the diamond substrate wherein said metal interconnect layer is applied using a technique selected from the group consisting of thick-film technique, and direct-write technique.

13. The method of claim 9, wherein said step of firing the metal interconnect layer and the diamond substrate a second time is comprised of the step of firing the metal interconnect layer and the diamond substrate at 850° C. for ten minutes.

14. The method of claim 10, wherein said step of applying a metal interconnect layer to the diamond substrate comprises the step of applying a metal interconnect layer to the diamond substrate wherein said metal interconnect layer is selected from the group consisting of gold, silver, and copper.

15. The method of claim 14, wherein said step of applying a metal interconnect layer to the diamond substrate comprises the step of applying a metal interconnect layer to the diamond substrate wherein said metal interconnect layer is applied using a technique selected from the group consisting of thick-film technique, and direct-write technique.

16. The method of claim 15, wherein said step of firing the metal interconnect layer and the diamond substrate a second time is comprised of the step of firing the metal interconnect layer and the diamond substrate at 850° C. for ten minutes.

* * * * *